United States Patent
Okuno et al.

(10) Patent No.: US 11,827,982 B2
(45) Date of Patent: Nov. 28, 2023

(54) PROCESSING APPARATUS

(71) Applicant: KOKUSAI ELECTRIC CORPORATION, Tokyo (JP)

(72) Inventors: Masanori Okuno, Toyama (JP); Toshihiko Yonejima, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 716 days.

(21) Appl. No.: 17/011,069

(22) Filed: Sep. 3, 2020

(65) Prior Publication Data

US 2020/0399755 A1  Dec. 24, 2020

Related U.S. Application Data

(63) Continuation of application No. PCT/JP2018/011995, filed on Mar. 26, 2018.

(51) Int. Cl.
*C23C 16/52* (2006.01)
*C23C 16/44* (2006.01)
*C23C 16/455* (2006.01)
*F23G 7/06* (2006.01)
*H01L 21/67* (2006.01)
(Continued)

(52) U.S. Cl.
CPC .......... *C23C 16/52* (2013.01); *C23C 16/4412* (2013.01); *C23C 16/45544* (2013.01); *F23G 7/06* (2013.01); *H01L 21/67017* (2013.01); *H01L 21/67109* (2013.01); *H01L 21/67303* (2013.01); *C23C 16/345* (2013.01); *H01L 21/0217* (2013.01); *H01L 21/02271* (2013.01)

(58) Field of Classification Search
None
See application file for complete search history.

(56) References Cited

U.S. PATENT DOCUMENTS

2009/0208649 A1  8/2009  Bailey
2010/0012292 A1  1/2010  Yamazaki
2014/0348717 A1  11/2014  Kawamura et al.

FOREIGN PATENT DOCUMENTS

JP    08-083772 A    3/1996
JP    11-137951 A    5/1999
(Continued)

OTHER PUBLICATIONS

Korean Office Action dated Mar. 17, 2022 for Korean Patent Application No. 10-2020-7025301.

Primary Examiner — Charles Capozzi
(74) Attorney, Agent, or Firm — Volpe Koenig

(57) ABSTRACT

Described herein is a technique capable of improving an operation rate of an apparatus using a plurality of detoxification apparatuses by removing by-products adhered thereto. According to one aspect of the technique, a processing apparatus includes a controller configured to perform a process recipe of forming a film on a substrate, The controller performs: (a) when an operation state of the first detoxification apparatus is an operation-in-progress state, checking an operation state of the second detoxification apparatus; (b) when the operation state of the second detoxification apparatus is not a maintenance-in-progress state, starting an operation of the second detoxification apparatus and switching the operation state of the first detoxification apparatus to the maintenance-in-progress state; and (c) when the operation state of the second detoxification apparatus is the maintenance-in-progress state, continuing an operation of the first detoxification apparatus.

11 Claims, 5 Drawing Sheets

(51) Int. Cl.
*H01L 21/673* (2006.01)
*C23C 16/34* (2006.01)
*H01L 21/02* (2006.01)

(56) References Cited

FOREIGN PATENT DOCUMENTS

| | | |
|---|---|---|
| JP | 11-197440 A | 7/1999 |
| JP | 2008-253879 A | 10/2008 |
| JP | 2009-534574 A | 9/2009 |
| JP | 2009-224588 A | 10/2009 |
| JP | 2014-227968 A | 12/2014 |
| JP | 2016-176095 A | 10/2016 |

PROCESSING APPARATUS

CROSS-REFERENCE TO RELATED PATENT APPLICATION

This non-provisional U.S. patent application claims priority under 35 U.S.C. § 119 of International Application No. PCT/JP2018/011995, filed on Mar. 26, 2018, in the WIPO, the entire contents of which are hereby incorporated by reference.

BACKGROUND

1. Field

The present disclosure relates to a processing apparatus.

2. Description of the Related Art

In a processing step of a semiconductor device, a harmful gas may be exhausted as an exhaust gas. Therefore, by performing a detoxifying process to the exhaust gas using a detoxification apparatus, the exhaust gas detoxified by the detoxification apparatus is discharged (exhausted) to an air atmosphere, for example.

However, when by-products adhere to the detoxification apparatus and are accumulated in the detoxification apparatus, the detoxification apparatus may be stopped even when a production process is being performed. As a result, a product substrate may be subject to lot rejection, and the production process may be interrupted to maintain the detoxification apparatus.

SUMMARY

Described herein is a technique capable of improving an operation rate of an apparatus by using a plurality of detoxification apparatuses to remove by-products adhered to the plurality of the detoxification apparatuses at a predetermined timing.

According to one aspect of the technique of the present disclosure, there is provided a processing apparatus including: a process chamber provided in a process furnace; an exhaust system connected to a plurality of detoxification apparatuses at least including a first detoxification apparatus and a second detoxification apparatus, and configured to exhaust a gas from the process chamber; and a controller configured to perform a process recipe of forming a film on a substrate loaded into the process chamber, wherein the controller is further configured to perform: (a) when an operation state of the first detoxification apparatus is an operation-in-progress state, checking an operation state of the second detoxification apparatus; (b) when the operation state of the second detoxification apparatus is not a maintenance-in-progress state, starting an operation of the second detoxification apparatus and switching the operation state of the first detoxification apparatus from the operation-in-progress state to the maintenance-in-progress state; and (c) when the operation state of the second detoxification apparatus is the maintenance-in-progress state, continuing an operation of the first detoxification apparatus without changing the operation state thereof.

DETAILED DESCRIPTION

Hereinafter, one or more embodiments (also simply referred to as "embodiments") according to the technique of the present disclosure will be described with reference to the drawings.

EMBODIMENT

Hereinafter, an embodiment according to the technique of the present disclosure will be described (1) Configuration of Substrate Processing Apparatus A configuration of a process furnace 202 of a substrate processing apparatus 100 serving as a processing apparatus according to the present embodiment will be described with reference to FIG. 1.

Figure 1:
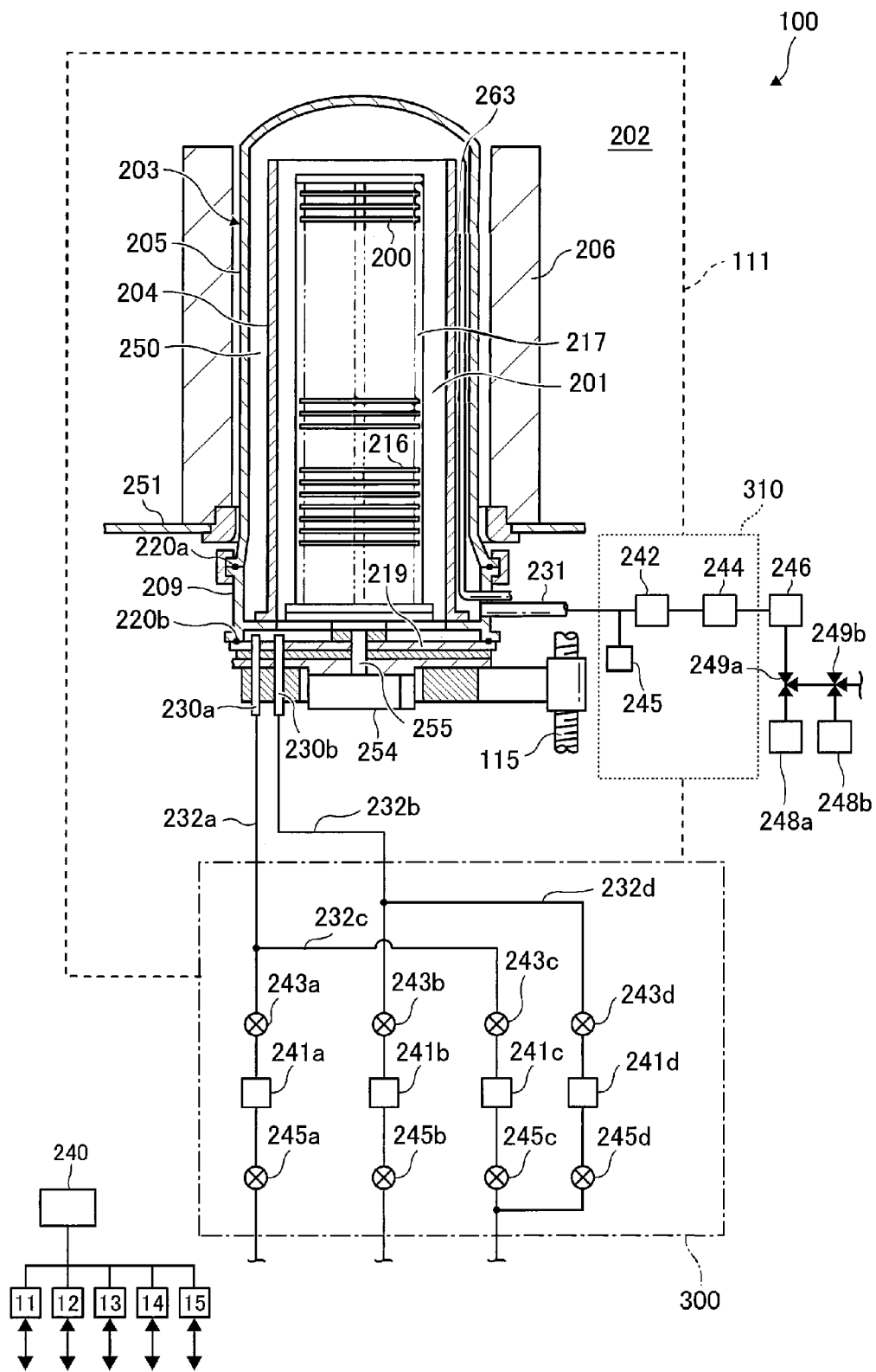
FIG. 1 schematically illustrates a vertical cross-section of a process furnace of a substrate processing apparatus according to one or more embodiments described herein.

As shown in FIG. 1, the process furnace 202 includes a process tube 203 serving as a reaction tube. The process tube 203 includes an inner tube 204 serving as an inner reaction tube and an outer tube 205 serving as an outer reaction tube and provided outside the inner tube 204. The inner tube 204 is of a cylindrical shape with open upper and lower ends. A process chamber 201 where a plurality of wafers including a wafer 200 are processed is provided in a hollow cylindrical portion of the inner tube 204. The process chamber 201 is configured to accommodate a boat 217.

A heater 206 is provided outside the process tube 203 so as to surround a side wall of the process tube 203. The heater 206 is of a cylindrical shape. The heater 206 is vertically supported by a heater base 251 serving as a support plate.

A manifold 209 serving as a furnace opening is provided under the outer tube 205. The outer tube 205 and the manifold 209 are concentrically arranged. The manifold 209 is of a cylindrical shape with open upper and lower ends. The manifold 209 is provided to support each of a lower end of the inner tube 204 and a lower end of the outer tube 205, and is engaged with the lower ends of the inner tube 204 and the outer tube 205. An O-ring 220a serving as a seal is provided between the manifold 209 and the outer tube 205.

A seal cap 219 capable of airtightly closing (sealing) a lower end opening of the manifold 209 is provided under the manifold 209. An O-ring 220b serving as a seal is provided on an upper surface of the seal cap 219 so as to be in contact with the lower end of the manifold 209.

A rotator (which is a rotating mechanism) 254 configured to rotate the boat 217 is provided about a center portion of the seal cap 219 opposite to the process chamber 201. A rotating shaft 255 of the rotator 254 is connected to the boat 217 through the seal cap 219 to support the boat 217 from thereunder. The rotator 254 is configured to rotate the wafer 200 accommodated in the boat 217 by rotating the boat 217.

The seal cap 219 is configured to be elevated or lowered in a vertical direction by a boat elevator 115 installed outside the process tube 203.

A transfer system (which is a transfer mechanism) according to the present embodiment is constituted by components such as the boat elevator 115, the boat 217 and the rotator 254. The components such as the boat elevator 115, the boat 217 and the rotator 254 are electrically connected to a transfer controller 11.

The boat 217 is configured to support the plurality of the wafers including the wafer 200 in a multistage manner. The plurality of the wafers are arranged in the boat 217 in a horizontal orientation or with their centers aligned with each other. Insulating plates 216 serving as a heat insulating material are provided under the boat 217. The insulating plates 216 are arranged in a horizontal orientation in a multistage manner.

A temperature sensor 263 serving as a temperature detector is provided in the process tube 203. A heating system (which is a heating mechanism) according to the present embodiment is constituted mainly by the heater 206 and the temperature sensor 263. A temperature controller 12 is electrically connected to the heater 206 and the temperature sensor 263.

Nozzles 230a and 230b are connected to the manifold 209 so as to communicate with the process chamber 201. Gas supply pipes 232a and 232b are connected to the nozzles 230a and 230b, respectively.

Gas supply sources including a process gas supply source (not shown) and a reactive gas supply source (not shown), valves 245a and 245b, mass flow controllers (MFCs) 241a and 241b and valves 243a and 243b are sequentially provided at the gas supply pipes 232a and 232b, respectively, in order from upstream sides to downstream sides of the gas supply pipes 232a and 232b. Gas supply pipes 232c and 232d are connected to downstream sides of the valves 243a and 243b of the gas supply pipes 232a and 232b, respectively. Purge gas supply sources (not shown), valves 245c and 245d, MFCs 241c and 241d and valves 243c and 243d are sequentially provided at the gas supply pipes 232c and 232d, respectively, in order from upstream sides to downstream sides of the gas supply pipes 232c and 232d.

A process gas supply system according to the present embodiment is constituted mainly by the process gas supply source (not shown), the valve 245a, the MFC 241a, the valve 243a, the gas supply pipe 232a and the nozzle 230a. A reactive gas supply system according to the present embodiment is constituted mainly by the reactive gas supply source (not shown), the valve 245b, the MFC 241b, the valve 243b, the gas supply pipe 232b and the nozzle 230b. A purge gas supply system according to the embodiments is constituted mainly by the purge gas supply sources (not shown), the valves 245c and 245d, the MFCs 241c and 241d, the valves 243c and 243d, the gas supply pipes 232c and 232d and the nozzles 230a and 230b. A gas supply controller 14 is electrically connected to the MFCs 241a through 241d, the valves 243a through 243d and the valves 245a through 245d.

A gas supplier 300 serving as a gas supply system is constituted mainly by the process gas supply system, the reactive gas supply system and the purge gas supply system.

An exhaust pipe 231 configured to exhaust an inner atmosphere of the process chamber 201 is provided at the manifold 209. The exhaust pipe 231 is disposed at a lower end portion of a cylindrical space 250 which is defined by a gap between the inner tube 204 and the outer tube 205. The exhaust pipe 231 communicates with the cylindrical space 250. A pressure sensor 245 serving as a pressure detector, an APC valve 242, an auxiliary pump 244, a main pump 246 serving as an exhauster, a three-way valve 249a, a detoxification apparatus 248a serving as a first detoxification apparatus, and a three-way valve 249b and a detoxification apparatus 248b serving as a second detoxification apparatus are sequentially provided at the exhaust pipe 231 in order from an upstream side to a downstream side of the exhaust pipe 231.

An exhaust structure 310 is constituted by the exhaust pipe 231, the pressure sensor 245, the APC valve 242 and the auxiliary pump 244, and an exhaust system is constituted by the exhaust structure 310, the main pump 246, the three-way valves 249a and 249b, the detoxification apparatus 248a and the detoxification apparatus 248b.

A pressure controller 13 is electrically connected to the APC valve 242 and the pressure sensor 245. An exhaust controller 15 is electrically connected to the auxiliary pump 244, the main pump 246, the three-way valves 249a and 249b and the detoxification apparatuses 248a and 248b.

That is, as shown in FIG. 1, the substrate processing apparatus 100 at least includes: a housing 111 including the process furnace 202; the gas supplier 300; and the exhaust structure 310.

A controller 240 serving as a control device is connected to each of the transfer controller 11, the temperature controller 12, the pressure controller 13, the gas supply controller 14 and the exhaust controller 15.

(2) Configuration of Detoxification Apparatuses 248a and 248b

The configuration of the detoxification apparatuses 248a and 248b will be described with reference to FIG. 2

Figure 2:
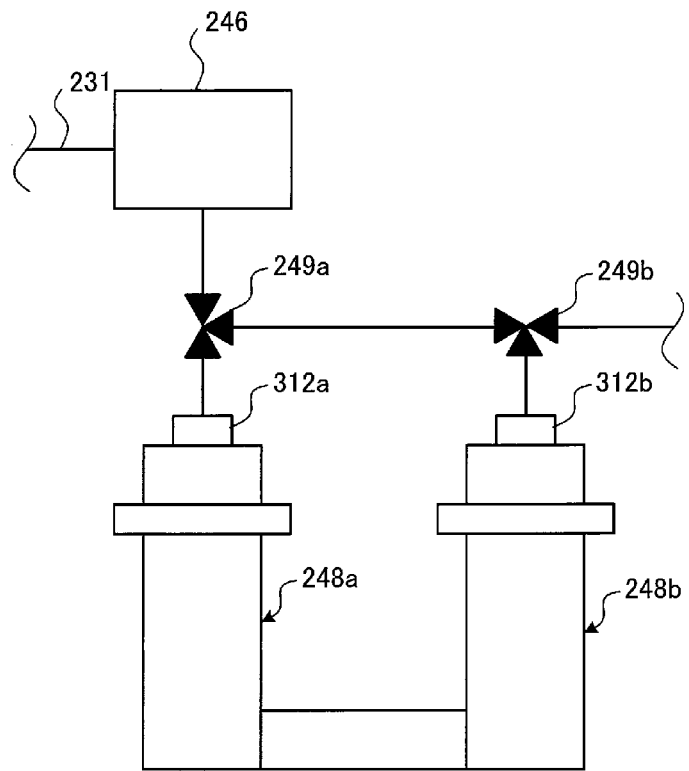
FIG. 2 schematically illustrates a detoxification apparatus used in the substrate processing apparatus according to the embodiments described herein.

As shown in FIG. 2, the detoxification apparatus 248a is connected to a downstream side of the main pump 246 via the three-way valve 249a, and the detoxification apparatus 248b is connected to the main pump 246 via the three-way valves 249a and 249b. Although not shown in the FIG. 1, the exhaust structure 310 may further include the main pump 246 and the three-way valves 249a and 249b.

The three-way valve 249a functions as a switch configured to switch a supply destination (which is a delivery destination) of an exhaust gas exhausted from the main pump 246 between the detoxification apparatus 248a and the three-way valve 249b. The three-way valve 249b functions as a switch configured to switch a supply destination (delivery destination) of the exhaust gas supplied (delivered) via the three-way valve 249a between the detoxification apparatus 248b and other place that is not subject to the operation of the detoxification apparatus 248b (for example, an air atmosphere).

That is, the exhaust gas is delivered to the detoxification apparatus 248a from the process chamber 201 via the exhaust pipe 231, the APC valve 242, the auxiliary pump 244, the main pump 246 and the three-way valve 249a, or is delivered to the detoxification apparatus 248b from the process chamber 201 via the exhaust pipe 231, the APC valve 242, the auxiliary pump 244, the main pump 246, the three-way valve 249a and the three-way valve 249b.

Alternatively, the exhaust gas may be exhausted to the air atmosphere via the exhaust pipe 231, the APC valve 242, the auxiliary pump 244, the main pump 246, the three-way valve 249a and the three-way valve 249b while bypassing the detoxification apparatus 248a and the detoxification apparatus 248b. That is, when the exhaust gas exhausted from the main pump 246 is a harmless gas, by controlling the three-way valve 249a and the three-way valve 249b, the exhaust gas may be exhausted to the air atmosphere while bypassing the detoxification apparatus 248a and the detoxification apparatus 248b.

Combustors 312a and 312b configured to combust (burn) the exhaust gas from the main pump 246 are provided at the detoxification apparatuses 248a and 248b, respectively. The exhaust gas sent to the detoxification apparatus 248a and the detoxification apparatus 248b. The combustors 312a and 312b burn the exhaust gas sent to the detoxification apparatuses 248a and 248b, respectively, to render the exhaust gas harmless.

In the detoxification apparatuses 248a and 248b, for example, by spraying water on the powder which is a by-product generated by burning the exhaust gas, by scraping off the powder using a tool such as a scraper or by performing both of the spraying and the scraping, the powder is removed. A maintenance is performed by removing the powder accumulated in the detoxification apparatus 248a or the detoxification apparatus 248b while in a non-operation state.

(3) Configuration of Controller 240

Figure 3:
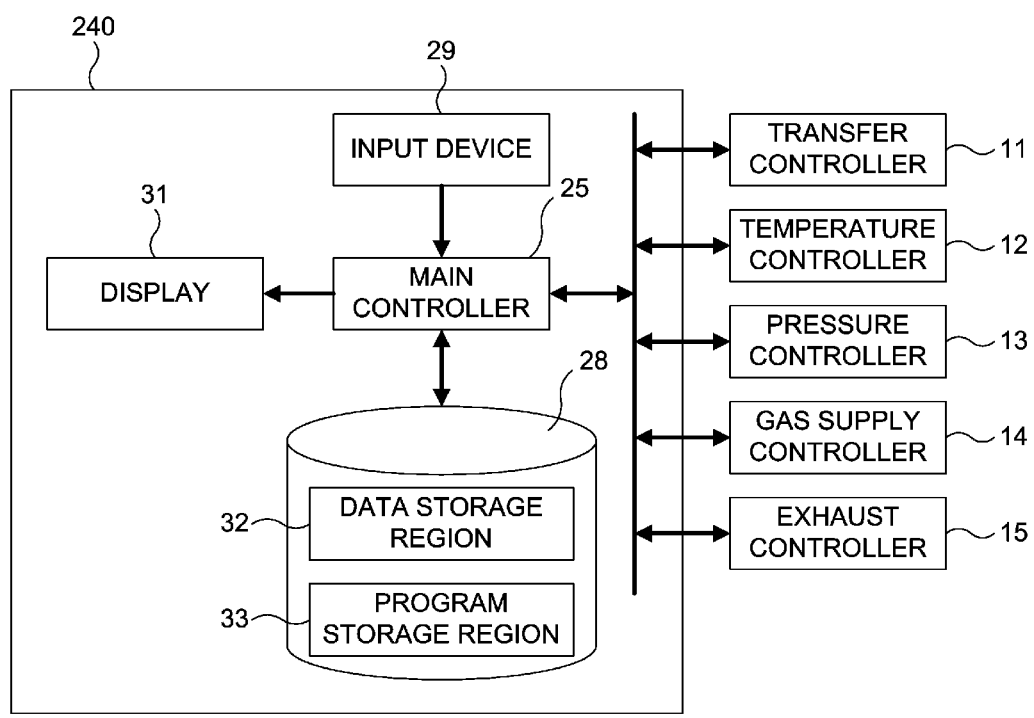
FIG. 3 is a block diagram schematically illustrating a configuration of a controller and related components used in the substrate processing apparatus according to the embodiments described herein.

A configuration of the controller 240 will be described in detail with reference to FIG. 3.

The controller 240 is constituted mainly by a main controller 25 such as a CPU (Central Processing Unit), a memory 28 such as a memory (RAM) and a hard disk drive (HDD), an input device 29 such as a mouse and a keyboard and a display 31 such as a monitor. The main controller 25, the memory 28, the input device 29 and the display 31 constitute an operation device capable of setting respective data.

The memory 28 includes a data storage region 32 where various data such as apparatus data are stored and a program storage region 33 where various programs are stored.

For example, control information of components of the substrate processing apparatus 100 while performing a process recipe described later is accumulated and stored in the data storage region 32 as the apparatus data. For example, an operation state of the detoxification apparatus 248a and an operation state of the detoxification apparatus 248b are accumulated and stored in the data storage region 32. According to the present embodiment, as the operation state, information such as an initialization completed state, an operation-in-progress state, a maintenance-in-progress state, a maintenance completed state, a standby state and an abnormal stop state is stored in the data storage region 32. In the present embodiment, the initialization completed state, the maintenance-in-progress state, the maintenance completed state, the standby state and the abnormal stop state may also be collectively or individually referred to as the "non-operation state" as mentioned above.

Various programs including the process recipe configured to control the substrate processing apparatus 100 according to a process sequence set by a user are stored in the program storage region 33. According to the present embodiment, the process recipe refers to a recipe (recipe file) in which information such as the process conditions and the process procedures of forming a film on the wafer 200 is defined. The recipe may include a plurality of processes.

An operating program of operating the detoxification apparatuses 248a and 248b, which will be described later, is stored in the program storage region 33. The operating program is configured to control the operations of the detoxification apparatuses 248a and 248b in conjunction with the process recipe.

Information such as a pre-set value (control value) or a transmission timing to be transmitted to the components such as the transfer controller 11, the temperature controller 12, the pressure controller 13, the gas supply controller 14 and the exhaust controller 15 may be stored in the recipe file, for each step of the process recipe.

For example, a touch panel is provided in the display 31. The touch panel is configured to display an operation screen configured to receive input of an operation command for the components of the substrate processing apparatus 100 described above (for example, the transfer system and the gas supplier 300). The operation device described above preferably includes at least the display 31 and the input device 29. The operation device may be, for example, an operating terminal device such as a computer and a mobile terminal device which includes at least the input device 29 and the display 31.

The main controller 25 is configured to control parameters such as an inner temperature of the process chamber 201, an inner pressure of the process chamber 201 and a flow rate of the process gas supplied into the process chamber 201 in order to perform a predetermined process (that is, a substrate processing described later) to the wafer 200 loaded in the process chamber 201.

That is, the main controller 25 executes a control program stored in the memory 28 and a recipe (for example, the process recipe serving as a substrate processing recipe stored in the memory 28) in accordance with an input from the input device 29 or an instruction from a higher-level controller such as an external host apparatus.

The transfer controller 11 is configured to control the operation of the transfer system configured to transfer the substrate (that is, the wafer 200) such as the boat elevator 115, a wafer transport device (not shown), the boat 217 and the rotator 254. Each of the boat elevator 115, the wafer transport device (not shown), the boat 217 and the rotator 254 includes a sensor (not shown). The transfer controller 11 is configured to notify the controller 240 of the values detected by the sensors provided at each of the components constituting the transfer system when the sensors detect a predetermined value or an abnormal value.

The temperature controller 12 is configured to adjust an inner temperature of the process furnace 202 by controlling a temperature of the heater 206 of the process furnace 202. The temperature controller 12 is also configured to notify the controller 240 of the value detected by the temperature sensor 263 when the temperature sensor 263 detects a predetermined value or an abnormal value.

The pressure controller 13 is configured to control the APC valve 242 based on the pressure detected by the pressure sensor 245 such that the inner pressure of the process chamber 201 is at a desired pressure at a desired timing. The pressure controller 13 is also configured to notify the controller 240 of the value detected by the pressure sensor 245 when the pressure sensor 245 detects a predetermined value or an abnormal value.

The gas supply controller 14 is configured to control the MFCs 241a through 241d such that a flow rate of a gas such as a source gas and a reactive gas described later supplied into the process chamber 201 is at a desired flow rate at a desired timing. Each of the MFCs 241a through 241d may include a sensor (not shown). The gas supply controller 14 is configured to notify the controller 240 of the values detected by the sensors provided at each of the MFCs 241a through 241d when the sensors detect a predetermined value or an abnormal value. The gas supply controller 14 is also configured to control opening and closing of the valves 243a through 243d and the valves 245a through 245d.

The exhaust controller 15 is configured to control the auxiliary pump 244, the main pump 246, the three-way valves 249a and 249b, the detoxification apparatuses 248a and 248b such that the inner atmosphere of the process chamber 201 is exhausted from the process chamber 201.

The main controller 25 is configured to execute the operating program of the detoxification apparatuses 248a and 248b in conjunction with the process recipe described above.

For each process recipe, the main controller 25 is configured to transmit an execution start signal at the start of the execution of the process recipe (or at the start of the execution of a processing such as a film-forming process) and an execution end signal at the end of the execution of the process recipe (or at the end of the execution of the processing) to the exhaust controller 15. When the exhaust controller 15 acquires (receives) the execution start signal or the execution end signal of the process recipe (or the processing), the exhaust controller 15 is configured to control the three-way valve 249a and/or the three-way valve 249b to perform a combustion process by the detoxification apparatus 248a or the detoxification apparatus 248b.

When the process recipe (or the processing) is started or terminated, the main controller 25 checks the operation state of the detoxification apparatus in the non-operation state other than the detoxification apparatus in the operation-in-progress state. For example, when the process recipe is being executed using the detoxification apparatus 248a (that is, the detoxification apparatus 248a is in the operation-in-progress state), the main controller 25 is configured to check the operation state of the detoxification apparatus 248b when the process recipe is terminated, or when the next process recipe is started or terminated.

Then, when the operation state of the detoxification apparatus 248b is not the maintenance-in-progress state (that is, the detoxification apparatus 248b is not under maintenance), the main controller 25 is configured to control the detoxification apparatuses 248a and 248b such that the detoxification apparatus 248b is operated, the detoxification apparatus 248a is stopped, the operation state of the detoxification apparatus 248a is switched from the operation-in-progress state to the maintenance-in-progress state, and then the maintenance of the detoxification apparatus 248a is performed. Specifically, when the operation state of the detoxification apparatus 248b is the initialization completed state, the maintenance completed state or the standby state, the main controller 25 is configured to control the detoxification apparatuses 248a and 248b such that the detoxification apparatus 248b is operated, the detoxification apparatus 248a is stopped, the operation state of the detoxification apparatus 248a is switched from the operation-in-progress state to the maintenance-in-progress state, and then the maintenance of the detoxification apparatus 248a is performed.

When the operation state of the detoxification apparatus 248b is the maintenance-in-progress state or the abnormal stop state, the main controller 25 controls the detoxification apparatus 248a to continue its operation without changing its operation state.

That is, while continuously executing the process recipe (the processing), the main controller 25 is configured to control the detoxification apparatuses 248a and 248b such that an operation process (the combustion process) and the maintenance are alternately and repeatedly performed to the detoxification apparatus 248a and the detoxification apparatus 248b.

The main controller 25 is further configured to control the detoxification apparatuses 248a and 248b such that at least one among the detoxification apparatus 248a and the detoxification apparatus 248b can be operated. The main controller 25 is further configured to control the detoxification apparatuses 248a and 248b such that at least one among the detoxification apparatus 248a and the detoxification apparatus 248b can be operated even during a standby time of the process recipe.

When the maintenance of the detoxification apparatus terminated during the execution of the process recipe, the main controller 25 switches the operation state of that detoxification apparatus to the standby state.

When the standby time of the process recipe exceeds a predetermined time, the main controller 25 stops the operation of the detoxification apparatus in the operation-in-progress state.

The main controller 25 is further configured to individually control the three-way valve 249a and/or the three-way valve 249b by the execution start signal indicating the start of the processing or the execution end signal indicating the end of the processing during the execution of the process recipe such that the exhaust gas is exhausted through the detoxification apparatus 248a or the detoxification apparatus 248b, or the exhaust gas is exhausted to the air atmosphere.

If an execution time of performing the process recipe is longer than a maintenance time of performing the maintenance, the main controller 25 controls the detoxification apparatuses 248a and 248b such that the detoxification apparatus in the operation-in-progress state and the detoxification apparatus in the non-operation state are switched between their operation states when the execution of the process recipe is terminated (that is, the supply destination of the exhaust gas is switched between the two detoxification apparatuses). For example, the main controller 25 is configured to individually control the three-way valves 249a and 249b such that the supply destination of the exhaust gas is switched from the detoxification apparatus 248a to the detoxification apparatus 248b at the end of the process recipe. That is, for example, the exhaust gas is supplied to the detoxification apparatus 248a during the execution of the process recipe, and the exhaust gas is supplied to the detoxification apparatus 248b when the process recipe is terminated.

If the execution time of performing the process recipe is shorter than the maintenance time of performing the maintenance, the main controller 25 controls the detoxification apparatuses 248a and 248b such that the detoxification apparatus in the operation-in-progress state and the detoxification apparatus in the non-operation state are switched when the next process recipe is started. For example, the main controller 25 is configured to individually control the three-way valves 249a and 249b such that the supply destination of the exhaust gas is switched from the detoxification apparatus 248a to the detoxification apparatus 248b when the next process recipe is started. That is, for example, the exhaust gas is supplied to the detoxification apparatus 248a during the execution of the process recipe, and the exhaust gas is supplied to the detoxification apparatus 248b when the next process recipe is started.

The exhaust controller 15 is further configured to individually control the detoxification apparatuses 248a and 248b such that the exhaust gas from the process chamber 201 is burnt by the combustors 312a and 312b to render the exhaust gas harmless.

When the operation state of the detoxification apparatus 248a or 248b is switched from the operation-in-progress state to the maintenance-in-progress state (under maintenance), the exhaust controller 15 controls the detoxification apparatus 248a or 248b whose operation state is switched to the maintenance-in-progress state to perform the maintenance. That is, deposits adhered to an inner wall thereof are removed by performing the maintenance. For example, by spraying the water into the detoxification apparatus 248a or 248b, by scraping off the deposits using the tool such as the scraper, or by performing both of the spraying and the scraping, it is possible to remove the deposits.

When it is detected that the detoxification apparatus 248a or the detoxification apparatus 248b has stopped due to a failure or an abnormality, the main controller 25 individually controls the three-way valves 249a and 249b such that the supply destination of the exhaust gas is not switched to the detoxification apparatus 248a or the detoxification apparatus 248b that has stopped due to the failure or the abnormality. That is, the exhaust gas is not delivered (supplied) to the detoxification apparatus 248a or the detoxification apparatus 248b that has stopped due to the failure or the abnormality.

The main controller 25 is further configured to control the transfer controller 11, the temperature controller 12, the pressure controller 13, the gas supply controller 14 and the exhaust controller 15 to perform a film-forming operation (film-forming step) of the substrate processing apparatus 100 by executing the process recipe. In conjunction with the exhaust controller 15, the main controller 25 controls the three-way valves 249a and 249b and the detoxification apparatuses 248a and 248b by the exhaust controller 15 such that the operations of the three-way valves 249a and 249b and the detoxification apparatuses 248a and 248b are monitored by the exhaust controller 15 for each event of the process recipe and the fluctuations of the operations of the three-way valves 249a and 249b and the detoxification apparatuses 248a and 248b are transmitted to the memory 28.

(4) Substrate Processing

Hereinafter, the substrate processing of the substrate processing apparatus 100 will be described in detail. When performing the substrate processing, the main controller 25 executes the process recipe stored in the program storage region 33 of the memory 28.

According to the present embodiment, the substrate processing will be described by way of an example in which a film is formed on the wafer 200 by alternately supplying a first process gas (that is, the source gas) and a second process gas (that is, the reactive gas).

Hereinafter, an example of the substrate processing in which a silicon nitride film ($Si_3N_4$ film. Hereinafter, also referred to as an "SiN film") is formed on the wafer 200 by using hexachlorodisilane ($Si_2Cl_6$, abbreviated as HCDS) gas as the source gas and ammonia ($NH_3$) gas as the reactive gas will be described. In the following descriptions, the operations of the components constituting the substrate processing apparatus 100 are controlled by the controller 240.

According to the example of the substrate processing, the SiN film is formed on the wafer 200 by performing a cycle a predetermined number of times (at least once). For example, the cycle may include: a step of supplying the HCDS gas to the wafer 200 in the process chamber 201; a step of removing the HCDS gas (residual gas) from the process chamber 201; a step of supplying the $NH_3$ gas to the wafer 200 in the process chamber 201; and a step of removing the $NH_3$ gas (residual gas) from the process chamber 201. The steps of the cycle are non-simultaneously performed.

In the present specification, the term "substrate" and "wafer" may be used as substantially the same meaning. That is, the term "substrate" may be substituted by "wafer" and vice versa.

<Wafer Charging and Boat Loading Step>

After the plurality of the wafers including the wafer 200 are charged (transferred) into the boat 217 (wafer charging step), the boat 217 charged with the plurality of the wafers is elevated by the boat elevator 115 and loaded (transferred) into the process chamber 201 (boat loading step). With the boat 217 loaded, the seal cap 219 seals (closes) the lower end of the manifold 209 via the O-ring 220b.

<Preparation Step>

The inner atmosphere of the process chamber 201 is exhausted (vacuum-exhausted) to the detoxification apparatus 248a or 248b or to the air atmosphere by the auxiliary pump 244 and the main pump 246 until the inner pressure of the process chamber 201 (that is, a space in which the plurality of the wafers including the wafer 200 are arranged) reaches a desired pressure from the atmospheric pressure. In the preparation step, the inner pressure of the process chamber 201 is measured by the pressure sensor 245, and the APC valve 242 is feedback-controlled based on the measured pressure information. The auxiliary pump 244, the main pump 246 and the detoxification apparatus 248a or 248b continuously vacuum-exhaust the inner atmosphere of the process chamber 201 until at least the processing such as the film-forming step of the substrate processing of the wafer 200 is completed.

The heater 206 heats the process chamber 201 until a temperature of the wafer 200 in the process chamber 201 reaches a desired temperature. When the heater 206 heats the process chamber 201, the state of the electric conduction to the heater 206 is feedback-controlled based on the temperature information detected by the temperature sensor 263 such that a desired temperature distribution of the inner temperature of the process chamber 201 is obtained. The heater 206 continuously heats the process chamber 201 until at least the processing of the wafer 200 is completed.

Then, the rotator 254 rotates the boat 217 and the plurality of the wafers including the wafer 200. That is, by rotating the boat 217 by the rotator 254, the plurality of the wafers including the wafer 200 are rotated. The rotator 254 continuously rotates the boat 217 and the plurality of the wafers until at least the processing of the wafer 200 is completed.

<First Purge Step>

Then, with the valves 245c, 243c, 245d and 243d open, $N_2$ gas is supplied into the process chamber 201 through the nozzles 230a and 230b, and is exhausted through the exhaust structure 310. The $N_2$ gas serves as a purge gas. As a result, the inner atmosphere of the process chamber 201 is purged.

<Film-Forming Step>

When the inner temperature of the process chamber 201 is stabilized at a predetermined process temperature, the film-forming step is performed by sequentially performing the following two steps, that is, a first step and a second step.

<First Step>

In the first step, the HCDS gas is supplied to the wafer 200 in the process chamber 201.

By opening of the valves 245a and 243a, the HCDS gas is supplied into the gas supply pipe 232a. A flow rate of the HCDS gas is adjusted by the MFC 241a. The HCDS gas whose flow rate is adjusted is supplied into the process chamber 201 through the nozzle 230a, and is exhausted through the exhaust structure 310. Thereby, the HCDS gas is supplied to the wafer 200 in the process chamber 201. Simultaneously, by opening of the valves 245c and 243c, the $N_2$ gas is supplied into the gas supply pipe 232c. A flow rate of the $N_2$ gas is adjusted by the MFC 241c. The $N_2$ gas whose flow rate is adjusted is supplied into the process chamber 201 together with the HCDS gas, and is exhausted through the exhaust pipe 231. By supplying the HCDS gas to the wafer 200 in the process chamber 201, a silicon-containing layer whose thickness is equivalent to, for example, several atomic layers is formed as a first layer on an outermost surface of the wafer 200.

After the first layer is formed, the valves 245a and 243a are closed to stop the supply of the HCDS gas into the process chamber 201. By maintaining the APC valve 242 open, the auxiliary pump 244 and the main pump 246 vacuum-exhaust the inner atmosphere of the process chamber 201 to remove the HCDS gas remaining in the process chamber 201 which did not react or which contributed to the formation of the first layer from the process chamber 201.

<Second Step>

After the first step is completed, the $NH_3$ gas is supplied to the wafer 200 in the process chamber 201, more specifically, supplied to the first layer formed on the wafer 200. In the second step, the $NH_3$ gas is thermally activated and then supplied to the wafer 200.

In the second step, the valves 245b, 243b, 245d and 243d are controlled in the same manners as the valves 245a, 243a, 245c and 243c are controlled in the first step. A flow rate of the $NH_3$ gas is adjusted by the MFC 241b. Then, the $NH_3$ gas whose flow rate is adjusted is supplied into the process chamber 201 through the nozzle 230b, and is exhausted through the exhaust pipe 231. Thereby, the $NH_3$ gas is supplied to the wafer 200 in the process chamber 201. The $NH_3$ gas supplied to the wafer 200 reacts with at least a portion of the first layer (that is, the silicon-containing layer) formed on the wafer 200 in the first step. As a result, the first layer is thermally nitrided by non-plasma, and is modified (changed) into a second layer, that is, a silicon nitride layer (also referred to as an "SiN layer").

After the second layer is formed, the valves 245b and 243b are closed to stop the supply of the $NH_3$ gas into the process chamber 201. The $NH_3$ gas remaining in the process chamber 201 which did not react or which contributed to the formation of the second layer and reaction by-products remaining in the process chamber 201 are exhausted from the process chamber 201 in the same manners as in the first step. Similar to the first step, the residual gas such as the $NH_3$ gas remaining in the process chamber 201 or the reaction by-products remaining in the process chamber 201 may not be completely removed.

<Performing a Predetermined Number of Times>

By performing the cycle wherein the first step and the second step are performed non-simultaneously a predetermined number of times, the SiN film of a predetermined thickness is formed on the wafer 200. That is, the cycle is performed (repeated) until a total thickness of the SiN film formed by stacking the second layer (that is, the SiN layer) by performing the cycle a plurality of times reaches the predetermined thickness under the conditions that the second layer formed in each cycle is thinner than the predetermined thickness.

<Second Purge Step>

After the film-forming step is completed, with the valves 245c, 243c, 245d and 243d open, the $N_2$ gas is supplied into the process chamber 201 through the nozzles 230a and 230b, and is exhausted through the exhaust pipe 231. The $N_2$ gas serves as the purge gas. The inner atmosphere of the process chamber 201 is purged with the $N_2$ gas, thus the gas remaining in the process chamber 201 or the reaction by-products remaining in the process chamber 201 are removed from the process chamber 201 (purging). Thereafter, the inner atmosphere of the process chamber 201 is replaced with the inert gas (substitution by the inert gas), and the inner pressure of the process chamber 201 is returned to the atmospheric pressure (returning to the atmospheric pressure).

<Boat Unloading and Wafer Discharging Step>

Thereafter, the seal cap 219 is lowered by the boat elevator 115 and a lower end of the process tube 203 is opened. The boat 217 with the processed wafers including the wafer 200 charged therein is transferred (unloaded) out of the process tube 203 through the lower end of the process tube 203 (boat unloading step). After the boat 217 is unloaded out of the process tube 203, the processed wafers including the wafer 200 are transferred (discharged) out of the boat 217 (wafer discharging step).

When the substrate processing described above is performed, combustion ash (which is by-products after the combustion process is performed by the detoxification apparatus 248a or the detoxification apparatus 248b) may be deposited in the detoxification apparatus 248a or the detoxification apparatus 248b. The combustion ash is in powder form, and adheres to and is deposited on a wall surface of a lower portion of the detoxification apparatus 248a or the detoxification apparatus 248b. Eventually, the detoxification apparatus 248a or the detoxification apparatus 248b clogs by the combustion ash. Therefore, the combustion ash should be removed. In addition, in order to remove the by-products adhered to the wall surface, the scraper, the water or both of the scraper and the water may be used at the same time. However, as time passes, the by-products are solidified. Therefore, it difficult to scrape the by-products with the scraper or to remove the by-products with the water. As a result, eventually, the detoxification apparatus 248a or the detoxification apparatus 248b clogs by the by-products.

According to the present embodiment, by providing a plurality of detoxification apparatuses (for example, at least two detoxification apparatuses such as the detoxification apparatuses 248a and 248b) downstream of the main pump 246 and by removing the by-products adhered to the detoxification apparatuses 248a and 248b under the control of the main controller 25 and the exhaust controller 15 in conjunction with the substrate processing serving as an example of the process recipe, it is possible to prevent the substrate processing apparatus 100 from being stopped due to the clogging of the detoxification apparatus 248a or 248b.

(5) Operation of Exhaust Controller 15

Figure 4:
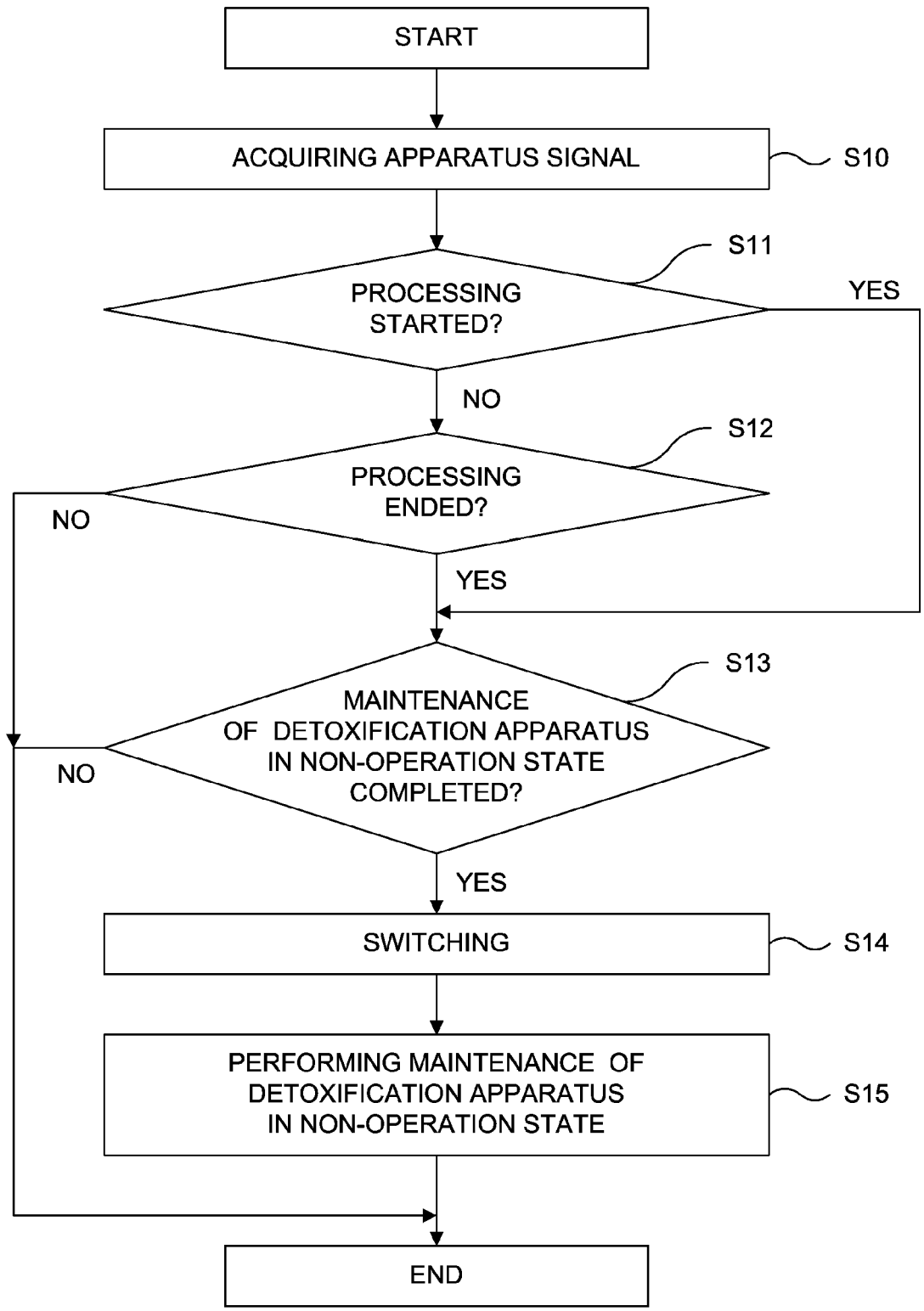
FIG. 4 is a flow chart schematically illustrating a control flow of an exhaust controller used in the substrate processing apparatus according to the embodiments described herein.

The operation of the exhaust controller 15 will be described with reference to FIG. 4.

The exhaust controller 15 acquires, for example, an apparatus signal during the execution of the process recipe of the substrate processing described above (step S10).

Then, when the apparatus signal acquired in the step S10 is the execution start signal indicating the start of the processing such as the film-forming step of the substrate processing (or the start of the process recipe) ("YES" in a step S11 shown in FIG. 4), the operation state of the detoxification apparatus in the non-operation state is checked. For example, when the detoxification apparatus 248a is in the operation-in-progress state, the operation state of the detoxification apparatus 248b in the non-operation state is checked. Specifically, for example, it is determined whether or not the maintenance of the detoxification apparatus 248b in the non-operation state is completed (step S13).

In the step S13, the exhaust controller 15 determines the operation state of the detoxification apparatus 248b in the non-operation state based on the information stored in the memory 28.

Then, for example, when it is determined that the maintenance of the detoxification apparatus 248b in the non-operation state is completed ("YES" in the step S13 shown in FIG. 4), the three-way valves 249a and 249b are switched to operate the detoxification apparatus 248b. Simultaneously, the operation state of the detoxification apparatus 248a is switched from the operation-in-progress state to the non-operation state (step S14), and the maintenance of the detoxification apparatus 248a whose operation state is switched to the non-operation state is performed (step S15). In addition, when it is determined that the maintenance of the detoxification apparatus 248b in the non-operation state is not completed ("NO" in the step S13 shown in FIG. 4), the operation states of the detoxification apparatuses 248a and 248b are not switched.

Then, when the apparatus signal acquired in the step S10 is the execution end signal indicating the end of the processing such as the film-forming step of the substrate processing (or the end of the process recipe) ("NO" in the step S11 and "YES" in a step S12 shown in FIG. 4), the operation state of the detoxification apparatus in the non-operation state is checked. For example, when the detoxification apparatus 248a is in the operation-in-progress state, the operation state of the detoxification apparatus 248b in the non-operation state is checked. Specifically, for example, it is determined whether or not the maintenance of the detoxification apparatus 248b in the non-operation state is completed (step S13).

In the step S13, the exhaust controller 15 determines the operation state of the detoxification apparatus 248b in the non-operation state based on the information stored in the memory 28.

Then, for example, when it is determined that the maintenance of the detoxification apparatus 248b in the non-operation state is completed ("YES" in the step S13 shown in FIG. 4), the three-way valves 249a and 249b are switched to operate the detoxification apparatus 248b. Simultaneously, the operation state of the detoxification apparatus 248a is switched from the operation-in-progress state to the non-operation state (step S14), and the maintenance of the detoxification apparatus 248a whose operation state is switched to the non-operation state is performed (step S15). In addition, when it is determined that the maintenance of the detoxification apparatus 248b in the non-operation state is not completed ("NO" in the step S13 shown in FIG. 4), the operation states of the detoxification apparatuses 248a and 248b are not switched.

That is, if the detoxification apparatus which was in the non-operation state at the start of the processing is in the maintenance-in-progress state (under maintenance) at the end of the processing, other detoxification apparatus in the operation-in-progress state is continued to operate without changing its operation state. However, if the maintenance of the detoxification apparatus in the non-operation state is completed at or before the end of the processing, the operation states of the detoxification apparatuses are switched.

In addition, if the maintenance of the detoxification apparatus which was in the non-operation state at the start of the processing is completed at or before the end of the processing, the detoxification apparatus whose maintenance is completed starts its operation to enter into the operation-in-progress state. Further, the operation state of other detoxification apparatus which was in the operation-in-progress state at the start of the processing is switched to the non-operation state at the end of the processing, and the maintenance thereof is performed. On the other hand, if the detoxification apparatus which was in the non-operation state at the start of the processing is in the maintenance-in-progress state (under maintenance) at the end of the processing, other detoxification apparatus which was in the operation-in-progress state at the start of the processing is continued to operate without changing its operation state.

That is, the operation states of the plurality of the detoxification apparatuses such as the detoxification apparatuses 248a and 248b are checked at the start of the processing and at the end of the processing. Thereby, if the operation state of the detoxification apparatus in the non-operation state is the initialization completed state, the maintenance completed state or the standby state at the start of the processing or at the end of the processing, the detoxification apparatus in the non-operation state starts its operation to enter into the operation-in-progress state, and the operation state of other detoxification apparatus which was in the operation-in-progress state is switched to the non-operation state so that the maintenance thereof is performed. However, if the operation state of the detoxification apparatus in the non-operation state is the maintenance-in-progress state or the abnormal stop state at the start of the processing or at the end of the processing, the operation states of the detoxification apparatuses are not switched. That is, the detoxification apparatus originally in the operation-in-progress state is continued to operate without changing its operation state.

(6) Process Sequence

Hereinafter, the process sequence of the main controller 25 when the maintenance time of the detoxification apparatuses 248a and 248b is shorter than the process time of performing the processing by the substrate processing apparatus 100 will be described with reference to FIG. 5.

When the process recipe is started, simultaneously with the start of the processing (first processing) of the substrate processing apparatus 100, for example, the detoxification apparatus 248a is operated. Then, the exhaust gas exhausted from the process chamber 201 is supplied to the detoxification apparatus 248a via the main pump 246 and the three-way valve 249a. In the detoxification apparatus 248a, the combustion process is performed by the combustor 312a.

When the processing (first processing) of the substrate processing apparatus 100 is terminated (completed), the execution end signal is transmitted to the exhaust controller 15 via the main controller 25, and the exhaust controller 15 that has acquired the execution end signal determines whether or not the detoxification apparatus 248b is under maintenance (that is, whether or not the detoxification apparatus 248b is in the maintenance-in-progress state).

When it is determined that the detoxification apparatus 248b is not under maintenance (that is, the detoxification apparatus 248b is not in the maintenance-in-progress state), then, the exhaust gas exhausted from the process chamber 201 is supplied to the detoxification apparatus 248b via the main pump 246, the three-way valve 249a and the three-way valve 249b. In the detoxification apparatus 248b, the combustion process is performed by the combustor 312b. Simultaneously, the detoxification apparatus 248a is stopped, the operation state of the detoxification apparatus 248a is switched to the maintenance-in-progress state, and the maintenance of the detoxification apparatus 248a is performed.

When the processing (second processing) of the substrate processing apparatus 100 is started, the execution start signal is transmitted to the exhaust controller 15 via the main controller 25, and the exhaust controller 15 that has acquired the execution start signal determines whether or not the detoxification apparatus 248a is under maintenance.

When it is determined that the detoxification apparatus 248a is under maintenance, the detoxification apparatus 248b is continued to operate without changing its operation state, and the exhaust gas exhausted from the process chamber 201 is supplied to the detoxification apparatus 248b via the main pump 246, the three-way valve 249a and the three-way valve 249b. In the detoxification apparatus 248b, the combustion process is performed by the combustor 312b.

When the processing (second processing) of the substrate processing apparatus 100 is terminated, the execution end signal is transmitted to the exhaust controller 15 via the main controller 25, and the exhaust controller 15 that has acquired the execution end signal determines whether or not the detoxification apparatus 248a is under maintenance.

Figure 5:
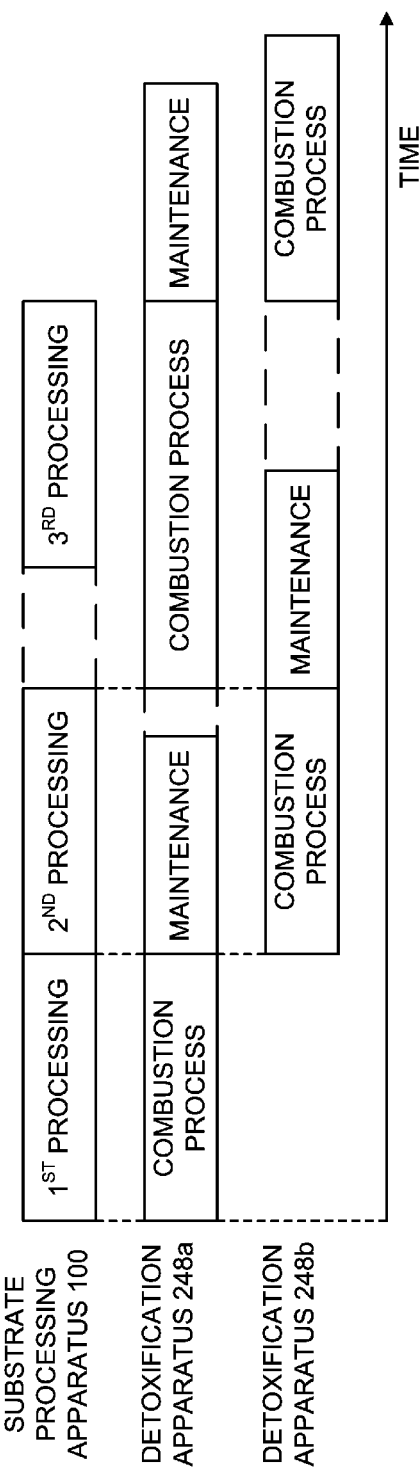
FIG. 5 schematically illustrates a process sequence of the substrate processing apparatus according to the embodiments described herein.

According to the present embodiment, as shown in FIG. 5, when the detoxification apparatus 248a is in standby after the maintenance of the detoxification apparatus 248a is completed (that is, when the maintenance time of the detoxification apparatus 248a is shorter than the execution time of performing the processing), the operation state of the detoxification apparatus 248a is changed to the standby state. When the processing (second processing) is terminated, the detoxification apparatus 248b in the operation-in-progress and the detoxification apparatus 248a in the non-operation state are controlled such that the detoxification apparatuses 248a and 248b are switched. Specifically, the detoxification apparatus 248b in the operation-in-progress is stopped, the operation state of the detoxification apparatus 248b is switched to the non-operation state (that is, the maintenance-in-progress state), and the maintenance of the detoxification apparatus 248b is performed. Simultaneously, the detoxification apparatus 248a in the non-operation state (that is, the standby state) is operated, and the exhaust gas from the process chamber 201 is supplied to the detoxification apparatus 248a via the main pump 246 and the three-way valve 249a. In the detoxification apparatus 248a, the combustion process is performed by the combustor 312a.

When the processing (third processing) of the substrate processing apparatus 100 is started, the execution start signal is transmitted to the exhaust controller 15 via the main controller 25, and the exhaust controller 15 that has acquired the execution start signal determines whether or not the detoxification apparatus 248b is under maintenance.

When it is determined that the detoxification apparatus 248b is under maintenance, the detoxification apparatus 248a is continues to operate without changing its operation state, and the exhaust gas from the process chamber 201 is supplied to the detoxification apparatus 248a via the main pump 246 and the three-way valve 249a. In the detoxification apparatus 248a, the combustion process is performed by the combustor 312a.

When the processing (third processing) of the substrate processing apparatus 100 is terminated, the execution end signal is transmitted to the exhaust controller 15 via the main controller 25, and the exhaust controller 15 that has acquired the execution end signal determines whether or not the detoxification apparatus 248b is under maintenance.

When the detoxification apparatus 248b is in the standby state after the maintenance of the detoxification apparatus 248b is completed, the detoxification apparatus 248a in the operation-in-progress and the detoxification apparatus 248b in the non-operation state (that is, the standby state) are controlled such that the detoxification apparatuses 248a and 248b are switched. Specifically, the detoxification apparatus 248a in the operation-in-progress is stopped, the operation state of the detoxification apparatus 248a is switched to the non-operation state (that is, the maintenance-in-progress state), and the maintenance of the detoxification apparatus 248a is performed. Simultaneously, the detoxification apparatus 248b in the non-operation state (that is, the standby state) is operated, and the exhaust gas from the process chamber 201 is supplied to the detoxification apparatus 248b via the main pump 246, the three-way valve 249a and the three-way valve 249b. In the detoxification apparatus 248b, the combustion process is performed by the combustor 312b.

Hereinafter, the process sequence of the main controller 25 when the maintenance time of the detoxification apparatus 248a or 248b is longer than the process time of performing the processing by the substrate processing apparatus 100 will be described with reference to FIG. 6.

When the process recipe is started, simultaneously with the start of the processing (first processing) of the substrate processing apparatus 100, for example, the detoxification apparatus 248a is operated. Then, the exhaust gas exhausted from the process chamber 201 is supplied to the detoxification apparatus 248a via the main pump 246 and the three-way valve 249a. In the detoxification apparatus 248a, the combustion process is performed by the combustor 312a.

When the processing (first processing) of the substrate processing apparatus 100 is terminated, the execution end signal is transmitted to the exhaust controller 15 via the main controller 25, and the exhaust controller 15 that has acquired the execution end signal determines whether or not the detoxification apparatus 248b is under maintenance (that is, whether or not the detoxification apparatus 248b is in the maintenance-in-progress state).

When it is determined that the detoxification apparatus 248b is not under maintenance (that is, the detoxification apparatus 248b is not in the maintenance-in-progress state), then, the detoxification apparatus 248b is operated, and the exhaust gas exhausted from the process chamber 201 is supplied to the detoxification apparatus 248b via the main pump 246, the three-way valve 249a and the three-way valve 249b. In the detoxification apparatus 248b, the combustion process is performed by the combustor 312b. Simultaneously, the detoxification apparatus 248a is stopped, the operation state of the detoxification apparatus 248a is switched to the maintenance-in-progress state, and the maintenance of the detoxification apparatus 248a is performed When the processing (second processing) of the substrate processing apparatus 100 is started, the execution start signal is transmitted to the exhaust controller 15 via the main controller 25, and the exhaust controller 15 that has acquired the execution start signal determines whether or not the detoxification apparatus 248a is under maintenance.

When it is determined that the detoxification apparatus 248a is under maintenance, the detoxification apparatus 248b is continued to operate without changing its operation state, and the exhaust gas exhausted from the process chamber 201 is supplied to the detoxification apparatus 248b via the main pump 246, the three-way valve 249a and the three-way valve 249b. In the detoxification apparatus 248b, the combustion process is performed by the combustor 312b.

When the processing (second processing) of the substrate processing apparatus 100 is terminated, the execution end signal is transmitted to the exhaust controller 15 via the main controller 25, and the exhaust controller 15 that has acquired the execution end signal determines whether or not the detoxification apparatus 248a is under maintenance.

Figure 6:
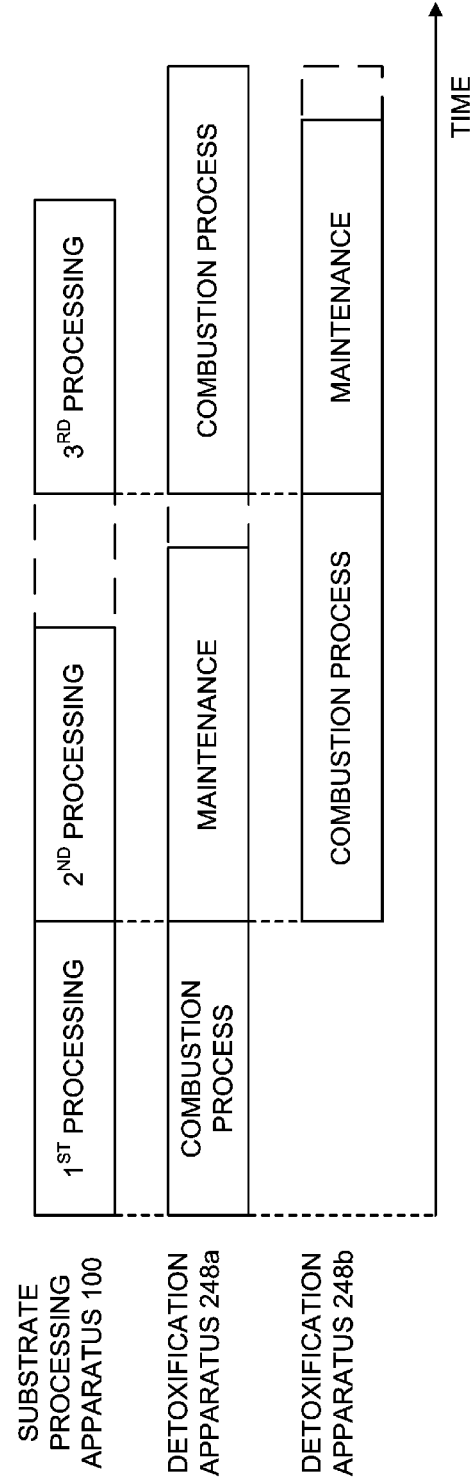
FIG. 6 schematically illustrates a modified example of the process sequence of the substrate processing apparatus according to the embodiments described herein.

According to the present embodiment, as shown in FIG. 6, when the detoxification apparatus 248a is under maintenance (that is, when the maintenance time of the detoxification apparatus 248a is longer than the execution time of performing the processing), the next processing (third processing) is in standby. After the maintenance of the detoxification apparatus 248a is completed, the next processing (third processing) is started. However, even though the next processing (third processing) is not started, when the standby time exceeds a predetermined time, the detoxification apparatus in the operation-in-progress state may be stopped.

When the processing (third processing) of the substrate processing apparatus 100 is started, the execution start signal is transmitted to the exhaust controller 15 via the main controller 25, and the exhaust controller 15 that has acquired the execution start signal determines whether or not the detoxification apparatus 248a is under maintenance.

When it is determined that the detoxification apparatus 248a is in the standby state after the maintenance of the detoxification apparatus 248a is completed, the detoxification apparatus 248a is operated, and the exhaust gas from the process chamber 201 is supplied to the detoxification apparatus 248a via the main pump 246 and the three-way valve 249a. In the detoxification apparatus 248a, the combustion process is performed by the combustor 312a. Simultaneously, the detoxification apparatus 248b is stopped, the operation state of the detoxification apparatus 248b is switched to the non-operation state (that is, the maintenance-in-progress state), and the maintenance of the detoxification apparatus 248b is performed.

When the processing (third processing) of the substrate processing apparatus 100 is terminated, the execution end signal is transmitted to the exhaust controller 15 via the main controller 25, and the exhaust controller 15 that has acquired the execution end signal determines whether or not the detoxification apparatus 248b in the non-operation state is under maintenance.

When it is determined that the detoxification apparatus 248b is under maintenance, the detoxification apparatus 248a is continued to operate without changing its operation state, and the exhaust gas from the process chamber 201 is supplied to the detoxification apparatus 248a via the main pump 246 and the three-way valve 249a. In the detoxification apparatus 248a, the combustion process is performed by the combustor 312a until the combustion process is completed.

(7) Effects According to Present Embodiment

According to the present embodiment described above, it is possible to provide one or more of the following effects.
(a) By removing the by-products adhered to the detoxification apparatus by the main controller 25 in conjunction with the exhaust controller 15, it is possible to prevent the substrate processing apparatus 100 from being stopped due to the clogging of the detoxification apparatus. Therefore, it is possible to improve an operation rate of an apparatus such as the substrate processing apparatus 100.
(b) By collectively managing the transfer controller 11, the temperature controller 12, the pressure controller 13, the gas supply controller 14 and the exhaust controller 15 by the main controller 25, it is possible to acquire information such as information of the apparatus, information of the main pump 246 and information of the detoxification apparatuses 248a and 248b. Therefore, it is possible to more accurately manage the apparatus and to control the apparatus in conjunction with each component of the apparatus.
(c) By alternately using the plurality of the detoxification apparatuses for each execution of the process recipe, it is possible to remove the by-products before the by-products generated by the combustion process are solidified.
(d) By determining a switching timing of the plurality of the detoxification apparatuses such as the detoxification apparatuses 248a and 248b by the main controller 25 in conjunction with the exhaust controller 15, it is possible to perform the maintenance before a maintenance threshold of the plurality of the detoxification apparatuses is reached. As a result, it is possible to extend a maintenance cycle of the plurality of the detoxification apparatuses, to improve the operation rate of the apparatus, and to reduce a maintenance cost.
(e) Since the main controller 25 is configured to output a switching signal of the plurality of the detoxification apparatuses to the exhaust controller 15 at the start (or the end) of the process recipe, even when the maintenance threshold of the plurality of the detoxification apparatuses is reached during the execution of the film-forming step of the process recipe and the error occurs, the process recipe is continuously executed, and the maintenance is performed after the process recipe is executed. As a result, it is possible to improve the operation rate of the apparatus.

(8) Modified Example of Present Embodiment

Figure 7:
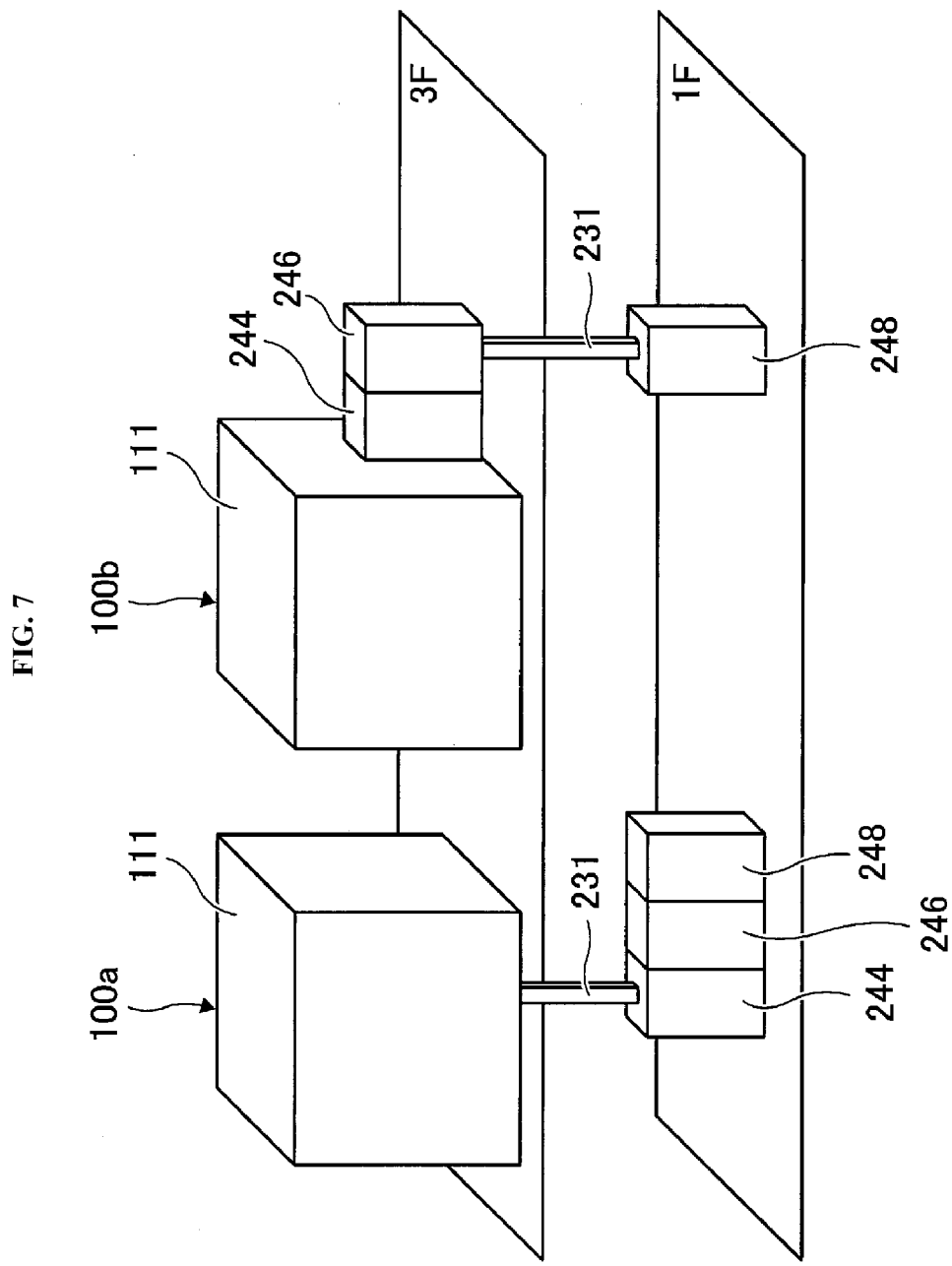
FIG. 7 schematically illustrates a modified example of the substrate processing apparatus according to the embodiments described herein.

FIG. 7 schematically illustrates a modified example of the substrate processing apparatus according to the present embodiment. According to the modified example, the exhaust structure 310 is constituted by the exhaust pipe 231, the auxiliary pump 244, the main pump 246 and a detoxification apparatus 248. The detoxification apparatus 248 is constituted by the three-way valves 249a and 249b and the detoxification apparatus 248a and the detoxification apparatus 248b described above.

According to a substrate processing apparatus 100a of the modified example, the housing 111 is installed on the third floor, and the auxiliary pump 244, the main pump 246 and the detoxification apparatus 248 are sequentially installed on the first floor in order from an upstream side to a downstream side of a gas flow. The housing 111 on the third floor and the auxiliary pump 244 on the first floor are connected by the exhaust pipe 231.

According to a substrate processing apparatus 100b of the modified example, the housing 111, the auxiliary pump 244 and the main pump 246 are sequentially installed on the third floor in order from the upstream side to the downstream side of the gas flow, and the detoxification apparatus 248 is installed on the first floor. The main pump 246 on the third floor and the detoxification apparatus 248 on the first floor are connected by the exhaust pipe 231.

That is, in addition to an example in which the substrate processing apparatus 100 and the exhaust structure 310 are installed on the same floor, the present embodiment may be preferably applied even when at least a part of the substrate processing apparatus 100 and the exhaust structure 310 are installed on different floors (for example, the substrate processing apparatuses 100a and 100b and the exhaust structure 310 shown in FIG. 7). Even when at least a part of the substrate processing apparatus 100 and the exhaust structure 310 are installed on different floors, it is possible to improve the operation rate of the apparatus by alternately removing the by-products adhered to the detoxification apparatuses 248a and 248b.

OTHER EMBODIMENTS

While the technique is described in detail by way of the above-described embodiment and the modified examples, the above-described technique is not limited thereto. The above-described technique may be modified in various ways without departing from the gist thereof.

While the above-described embodiments are described by way of an example in which the exhaust controller 15 configured to control the auxiliary pump 244, the main pump 246, the three-way valves 249a and 249b and the detoxification apparatuses 248a and 248b is electrically connected to the main controller 25, the above-described technique is not limited thereto. For example, the above-described technique may also be preferably applied when a pump controller configured to control the auxiliary pump 244 and the main pump 246 and a detoxification controller configured to control the detoxification apparatuses 248a and 248b are provided instead of the exhaust controller 15, and the pump controller and the detoxification controller are electrically connected to the main controller 25.

While the above-described embodiments are described by way of an example in which a batch type substrate processing apparatus configured to simultaneously process a plurality of substrates is used to form the film, the above-described technique is not limited thereto. In addition, the above-described embodiments are described by way of an example in which a substrate processing apparatus including a hot wall type process furnace is used to form the film, the above-described technique is not limited thereto. For example, the above-described technique may also be preferably applied to form the film using a substrate processing apparatus including a cold wall type process furnace.

For example, the above-described embodiments are described by way of an example in which a semiconductor manufacturing apparatus configured to process a semiconductor wafer (for example, the substrate processing apparatus 100) is used. However, the above-described technique is not limited thereto. The above-described technique may be applied to an LCD (Liquid Crystal Display) manufacturing apparatus configured to process a glass substrate.

According to some embodiments in the present disclosure, it is possible to improve the operation rate of an apparatus by using a plurality of detoxification apparatuses to remove the by-products adhered to the plurality of the detoxification apparatuses at a predetermined timing.

What is claimed is:

1. A processing apparatus comprising:
    a process chamber provided in a process furnace;
    an exhaust system connected to a plurality of detoxification apparatuses at least comprising a first detoxification apparatus and a second detoxification apparatus, and configured to exhaust a gas from the process chamber; and
    a controller configured to perform a process recipe of forming a film on a substrate loaded into the process chamber,
    wherein the controller is further configured to perform:
    (a) when an operation state of the first detoxification apparatus is an operation-in-progress state, checking an operation state of the second detoxification apparatus;
    (b) when the operation state of the second detoxification apparatus is not a maintenance-in-progress state, starting an operation of the second detoxification apparatus and switching the operation state of the first detoxification apparatus from the operation-in-progress state to the maintenance-in-progress state; and
    (c) when the operation state of the second detoxification apparatus is the maintenance-in-progress state, continuing an operation of the first detoxification apparatus without changing the operation state thereof.

2. The processing apparatus of claim 1, further comprising a memory configured to store an operation state of each of the detoxification apparatuses, wherein the operation state comprises at least one of an initialization completed state, the operation-in-progress state, the maintenance-in-progress state, a maintenance completed state, a standby state and an abnormal stop state.

3. The processing apparatus of claim 1, wherein the controller is configured to control each of the detoxification apparatuses such that an operation thereof and a maintenance thereof are repeatedly performed.

4. The processing apparatus of claim 1, wherein the controller is configured to control at least one among the detoxification apparatuses to be in the operation-in-progress state even during a standby time of the process recipe.

5. The processing apparatus of claim 1, wherein the controller is configured to control the second detoxification apparatus such that, when a maintenance of the second detoxification apparatus in the maintenance-in-progress state is terminated during execution of the process recipe, the operation state of the second detoxification apparatus is changed to a standby state.

6. The processing apparatus of claim 1, wherein the controller is configured to control the first detoxification apparatus such that, when a standby time of the process recipe exceeds a predetermined time, the operation of the first detoxification apparatus in the operation-in-progress state is stopped.

7. The processing apparatus of claim 1, wherein the exhaust system further comprises a switch configured to switch a supply destination of the gas exhausted from the process chamber,
    wherein the controller is configured to control the switch during execution of the process recipe such that the gas is supplied to one of the detoxification apparatuses by a signal indicating the start of the process recipe or the end of the process recipe.

8. The processing apparatus of claim 1, wherein the controller is configured to control the plurality of the detoxification apparatuses such that, when an execution time of performing the process recipe is longer than a maintenance time of performing a maintenance of each of the detoxification apparatuses, the operation state of the first detoxification apparatus and the operation state of the second detoxification apparatus are switched at the end of the process recipe.

9. The processing apparatus of claim 1, wherein the controller is configured to control the plurality of the detoxification apparatuses such that, when an execution time of performing the process recipe is shorter than a maintenance time of performing a maintenance of each of the detoxification apparatuses, the operation state of the first detoxification apparatus and the operation state of the second detoxification apparatus are switched at the start of the process recipe.

10. The processing apparatus of claim 1, wherein the controller is configured to control the plurality of the detoxification apparatuses to perform:
(d) rendering the gas harmless by burning the gas exhausted from the process chamber by a combustor provided at each of the detoxification apparatuses; and
(f) when the operation state of the first detoxification apparatus is switched from the operation-in-progress state to the maintenance-in-progress state, removing deposits adhered to an inner wall of the first detoxification apparatus.

11. The processing apparatus of claim 1, wherein the exhaust system further comprises:
an exhaust pipe; and
an exhauster connected to the exhaust pipe, and
wherein the process furnace and at least a part of the exhaust system are provided on a same floor, and the plurality of the detoxification apparatuses are provided on another floor.

* * * * *